United States Patent
Kawashima

(10) Patent No.: US 9,590,391 B2
(45) Date of Patent: Mar. 7, 2017

(54) REFLECTOR, SURFACE-EMITTING LASER, SOLID-STATE LASER DEVICE, OPTOACOUSTIC SYSTEM, AND IMAGE-FORMING APPARATUS

(71) Applicant: CANON KABUSHIKI KAISHA, Tokyo (JP)

(72) Inventor: Takeshi Kawashima, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/028,320

(22) PCT Filed: Aug. 5, 2014

(86) PCT No.: PCT/JP2014/071140
§ 371 (c)(1),
(2) Date: Apr. 8, 2016

(87) PCT Pub. No.: WO2015/052986
PCT Pub. Date: Apr. 16, 2015

(65) Prior Publication Data
US 2016/0268774 A1    Sep. 15, 2016

(30) Foreign Application Priority Data

Oct. 10, 2013   (JP) ................................. 2013-212906

(51) Int. Cl.
*H01S 5/183*   (2006.01)
*H01S 5/02*    (2006.01)
(Continued)

(52) U.S. Cl.
CPC .......... *H01S 5/18361* (2013.01); *B41J 2/447* (2013.01); *B41J 2/473* (2013.01);
(Continued)

(58) Field of Classification Search
CPC .... H01S 5/18361; H01S 5/0212; B41J 2/447; B41J 2/473; G03G 15/04036
See application file for complete search history.

(56) References Cited

U.S. PATENT DOCUMENTS

| 6,597,017 B1    | 7/2003 | Seko |
| 2007/0145406 A1 | 6/2007 | Han  |

(Continued)

FOREIGN PATENT DOCUMENTS

| EP | 1956664 A1    | 8/2008  |
| EP | 2355181 A2    | 8/2011  |
| JP | 2000-349393 A | 12/2000 |

*Primary Examiner* — Sandra Brase
(74) *Attorney, Agent, or Firm* — Canon U.S.A. Inc., IP Division

(57) ABSTRACT

In a reflector including an AlGaN layer, an InGaN layer, and a GaN layer placed therebetween, high reflectivity and a wide reflection band are achieved. A reflector includes a substrate containing GaN; first layers containing $Al_xGa_{1-x}N$; second layers containing $In_yGa_{1-y}N$; and a third layer containing GaN, the first, second, and third layers being stacked on the substrate. The first and second layers are alternately stacked, the third layer is placed between one of the first layers and one of the second layers, x and y satisfy a specific formula, the first layers have a thickness less than the thickness of the second layers, and the second layers have an optical thickness of $\lambda/8$ to $3\lambda/8$, where $\lambda$ is the central wavelength of the reflection band of the reflector.

20 Claims, 8 Drawing Sheets

(51) Int. Cl.
  *B41J 2/447* (2006.01)
  *B41J 2/47* (2006.01)
  *G03G 15/04* (2006.01)
  *H01S 3/0941* (2006.01)
  *H01L 21/02* (2006.01)

(52) U.S. Cl.
  CPC ..... *G03G 15/04036* (2013.01); *H01S 5/0212*
    (2013.01); *H01L 21/0254* (2013.01); *H01L*
    *21/0262* (2013.01); *H01L 21/02458* (2013.01);
      *H01L 21/02507* (2013.01); *H01S 3/0941*
                                      (2013.01)

(56)            References Cited

U.S. PATENT DOCUMENTS

| 2008/0049329 | A1* | 2/2008 | Takeuchi | B82Y 20/00 |
| | | | | 359/589 |
| 2009/0278113 | A1 | 11/2009 | Chung | |
| 2009/0286342 | A1* | 11/2009 | Takahashi | B82Y 20/00 |
| | | | | 438/32 |
| 2011/0026555 | A1 | 2/2011 | Takeuchi | |
| 2012/0261687 | A1 | 10/2012 | Shim | |

\* cited by examiner

REFLECTOR, SURFACE-EMITTING LASER, SOLID-STATE LASER DEVICE, OPTOACOUSTIC SYSTEM, AND IMAGE-FORMING APPARATUS

CROSS-REFERENCE TO RELATED APPLICATIONS

This application is a National Stage filing International Application No. PCT/JP2014/071140 filed Aug. 5, 2014, which claims the benefit of Japanese Patent Application No. 2013-212906 filed Oct. 10, 2013, the disclosures of each of which are hereby incorporated by reference herein in their entirety.

TECHNICAL FIELD

The present invention relates to a reflector, a surface-emitting laser, a solid-state laser device, an optoacoustic system, and an image-forming apparatus.

BACKGROUND ART

A vertical-cavity surface-emitting laser (VCSEL) is a laser in which a pair of reflectors and an active layer interposed therebetween form a resonator perpendicular to a substrate. The reflectors used are distributed Bragg reflectors (DBRs) each including several layers, formed by depositing two types of materials with different refractive indexes, having an optical thickness corresponding to a ¼ wavelength. The reduction in loss by increasing the reflectivity of the DBRs is a challenge to increase the laser power of the VCSEL. In order to cope with variations in emission wavelengths during device manufacturing and changes in emission wavelengths due to heating, the reflection band of the DBRs needs to he increased. In usual, the difference in refractive index between two types of materials needs to be large in order to increase the reflectivity and reflection band of the DBRs.

However, in the case of using two different types of materials having different lattice strains, there is a problem. in that crystal defects are induced. In order to cope with this problem, Patent Literature 1 discloses a strain-compensated DBR in which a large number of AlGaN layers having tensile strain for GaN and a large number of InGaN layers having compressive strain for GaN are stacked on a Gall substrate. Furthermore, Patent Literature 1 discloses that crystal quality is enhanced by interposing strain-free GaN layers between AlGaN layers and InGaN layers.

CITATION LIST

Patent Literature

PTL 1 Japanese Patent Laid-Open No. 2000-349393

SUMMARY OF INVENTION

Technical Problem

In the DBR disclosed in Patent Literature 1, the optical thickness of each of the AlGaN, InGaN, and GaN layers is not appropriate because the refractive index of GaN is between the refractive index of AlGaN and the refractive index of InGaN. Therefore, the phase of light reflected at interfaces between these layers shifts to reduce the reflectivity of a reflective film. Thus, the DBR has reduced reflectivity and a narrow reflection band.

Solution to Problem

The present invention provides a reflector which includes AlGaN layers, InGaN layers, and GaN layers placed therebetween and which has high reflectivity and a wide reflection band.

A reflector according to the present invention includes a substrate containing GaN, first layers containing $Al_xGa^{1-x}N$, second layers containing $In_yGa_{1-y}N$, and a third layer containing GaN, the first, second, and third layers being stacked on the substrate. The first and second layers are alternately stacked, the third layer is placed between one of the first layers and one of the second layers, x in $Al_xGa_{1-x}N$ and y in $In_yGa_{1-y}N$ satisfy the inequality $0.00<4.66y<x\le1.00$, the first layers have a thickness less than the thickness of the second layers, and the second layers have an optical thickness of $\lambda/8$ to $3\lambda/8$, where $\lambda$ is the central wavelength of the reflection band of the reflector.

Further features of the present invention will become apparent from the following description of exemplary embodiments with reference to the attached drawings.

Advantageous Effect of Invention

According to the present invention, the following reflector can be obtained: a reflector which includes AlGaN layers, InGaN layers, and GaN lavers placed therebetween and which has high reflectivity and a wide reflection band.

DESCRIPTION OF EMBODIMENTS

First Embodiment

Figure 1A:
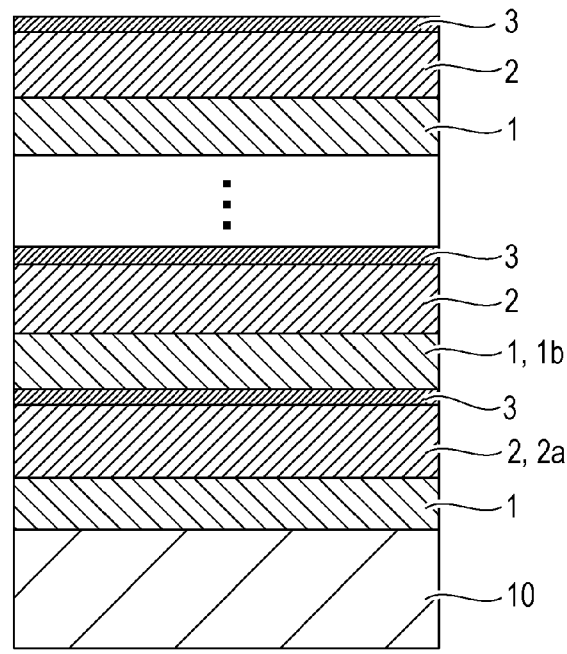
FIG. 1A is a schematic view of an example of a reflector according to a first embodiment of the present invention.

A reflector according to a first embodiment of the present invention includes a substrate containing GaN, first layers containing $Al_xGa_{1-x}N$, second layers containing $In_yGa_{1-y}N$, and third layers containing GaN. The first, second, and third layers are stacked on the substrate. The third layers are placed between at least some of the first and second layers.

The first layers, which contain $Al_xGa_{1-x}N$, have tensile strain and the second layers, which contain $In_yGa_{1-y}N$, have compressive strain. The first and second layers are alternately stacked; hence, strain can be compensated for. The first layers are those epitaxially grown on the substrate, which contains GaN. The following values are set to be substantially equal to each other: the absolute value of the product of the strain $\epsilon_1$ and thickness $t_1$ of the first layers, which have tensile strain, and the absolute value of the product of the strain $\epsilon_2$ and thickness $t_2$ of the second layers, which have compressive strain. This compensates the reflector for strain to suppress the occurrence of cracks or pits due to lattice strains.

The strain $\epsilon$ of a layer is defined by the following equation:

$$\epsilon = (a_s - a_0)/a_0 \qquad (1)$$

where $a_0$ is the lattice constant of the layer in which a crystal is unstrained and $a_s$ is the lattice constant of the layer in which the crystal is strained. When $\epsilon$ is positive, the layer has tensile strain. When $\epsilon$ is negative, the layer has compressive strain. Suppose that, for example, an InGaN layer is epitaxially grown on a GaN substrate so as to have a thickness not more than the critical thickness. In this case, the InGaN layer is grown at the lattice constant of GaN, which forms the substrate. Thus, the strain $\epsilon$ of the InGaN layer can be determined in such a way that the lattice constant of GaN is substituted for $a_s$ and the lattice constant of unstrained InGaN that is calculated from the composition of a mixed crystal is substituted for $a_0$ in Equation (1). Since the lattice constant of InGaN is greater than that of GaN, the strain $\epsilon$ of the InGaN layer is negative.

It is difficult to set the absolute value of the product of the strain $\epsilon_1$ and thickness $t_1$ of the first layers and the absolute value of the product of the strain $\epsilon_2$ and thickness $t_2$ of the second layers to be substantially equal to each other in terms of manufacture. Thus, in the present invention, the absolute value of the product of the strain $\epsilon_1$ and thickness $t_1$ of the first layers and the absolute value of the product of the strain $\epsilon_2$ and thickness $t_2$ of the second layers may satisfy the following inequality:

$$0.80 \leq |\epsilon_2 t_2|/|\epsilon_1 t_1| \leq 1.20 \qquad (2).$$

The absolute value of the product of the strain $\epsilon_1$ and thickness $t_1$ of the first layers and the absolute value of the product of the strain $\epsilon_2$ and thickness $t_2$ of the second layers more preferably satisfies the following inequality:

$$0.85 \leq |\epsilon_2 t_2|/|\epsilon_1 t_1| \leq 1.15 \qquad (3).$$

The absolute value of the product of the strain $\epsilon_1$ and thickness $t_1$ of the first layers and the absolute value of the product of the strain $\epsilon_2$ and thickness $t_2$ of the second layers most preferably satisfies the following inequality:

$$0.90 \leq |\epsilon_2 t_2|/|\epsilon_1 t_1| \leq 1.10 \qquad (4).$$

In the case of increasing the In content of the second layers for the purpose of increasing the reflectivity of the reflector, which includes the third layers which contains GaN and which are placed between the first and second layers, the bandgap of the second layers is reduced and the light absorption coefficient thereof is increased. Therefore, the In content of the second layers is set such that the bandgap of the second layers is greater than the energy of light with a wavelength equal to the central wavelength $\lambda$ of the reflection band of the reflector as described below.

In addition, the absolute value of the strain $\epsilon_1$ of the first layers is set to be greater than the absolute value of the strain of the second layers. That is, $|\epsilon_1| \geq |\epsilon_2|$ holds. This relation is expressed by the following inequality:

$$(a_1 - a_2)y/(a_2 - a_3) < x \qquad (5)$$

where x is the Al content of the first layers, y is the In content of the second layers, $a_1$ represents the a-axis lattice constant of InN and is 3.548 Å, $a_2$ represents the a-axis lattice constant of GaN and is 3.189 Å, and $a_3$ represents the a-axis lattice constant of AlN and is 3.112 Å. Since y is greater than 0.00 and x is 1.00 or less, inequality (5) can be converted into the following inequality:

$$0.00 < 4.66y < x \leq 1.00 \qquad (6).$$

For example, when y is 0.05, x may be greater than 0.23. From inequality (6), y needs to be 0.21 or less in order to allow x to be 1.00 or less. On the other hand, when the In content y is small, the refractive index of the second layers is close to that of GaN and the difference in refractive index between the first and second layers is small. Therefore, the In content y is preferably 0.02 or more. That is, the In content y is 0.02 to 0.21.

When the In content y is 0.02, the Al content x is 0.09. Therefore, the Al content x is 0.09 to 1.00. However, $Al_xGa_{1-x}N$ with an Al content x of more than 0.50 has high resistivity and is hard to use in surface-emitting lasers in which carriers are injected through reflectors as described below. Therefore, the Al content x is preferably 0.09 to 0.50 for use in such surface-emitting lasers and more preferably 0.09 to 0.40. From Inequality (6), the In content y ranges from 0.02 to 0.11 or 0.02 to 0.09 depending on the Al content x.

In the case of setting the absolute value of the product of the strain $\epsilon_1$ and thickness $t_1$ of the first layers and the absolute value of the product of the strain $\epsilon_2$ and thickness $t_2$ of the second layers to be substantially equal to each other for the purpose of compensating for strain, the thickness $t_1$ of the first layers is less than the thickness $t_2$ of the second layers. That is, the inequality $t_1 < t_2$ holds.

In order to achieve increased reflectivity, the optical thickness of the second layers is set to $\lambda/4$. Such optical thickness allows phases to be aligned and allows the reflectivity to be large. This results in that the optical thickness of the first layers is less than $\lambda/4$. Therefore, the thickness of the third layers (GaN-containing layers) is set such that such a shortage in optical thickness is compensated for. That is, the thickness of a set of each of the first layers, a corresponding one of the second layers, and a corresponding one of the third layers is set to $\lambda/2$.

The optical thickness of the second layers may be varied within the range of about $\lambda/4 \pm \lambda/8$ in consideration of manufacturing errors and strain compensation. The optical thickness of the second layers is preferably set within the range of about $\lambda/4 \pm \lambda/16$. In particular, the optical thickness of the second layers preferably ranges from $\lambda/8$ to $3\lambda/8$ and more preferably $3\lambda/16$ to $5\lambda/16$.

The third layers (GaN-containing layers) may be placed between at least some of the first and second layers. At least one of the third layers is preferably placed between one of the second layers and one of the first layers that is located on the side of the second layer opposite to the substrate and that is closest to the second layer. This is because the third layers function as protective layers for suppressing the decomposition of $In_yGa_{1-y}N$ in the second layers. A fourth layer (GaN-containing layer) below may be placed between the second layer and another one of the first layers that is located on the side of the substrate close to the second layer and that is closest to the second layer. The fourth layer compensates for a shortage of the optical thickness of the first layers and functions as an intermediate layer for growing the first and second layers with good crystallinity.

The reflector is further described in detail with reference to FIGS. 1A and 1B. A reflector shown in FIG. 1A includes a substrate 10 containing GaN, low-refractive index layers (first layers) 1 containing $Al_xGa_{1-x}N$, high-refractive index layers (second layers) 2 containing $In_yGa_{1-y}N$, and first intermediate layers (third layers) 3 containing GaN. The low-refractive index layers 1, the high-refractive index layers 2, and the first. intermediate layers 3 are stacked on the substrate 10. The low-refractive index layers 1 and the high-refractive index layers 2 are alternately stacked. The first intermediate layers 3 are placed between the low-refractive index layers 1 and the high-refractive index layers 2. This reflector is composed of a plurality of stacked structures each including a corresponding one of the low-refractive index layers 1, a corresponding one of the high-refractive index layers 2, and a corresponding one of the first intermediate layers 3. One of the first intermediate layers 3 is placed between a high-refractive index. layer 2a that is one of the high-refractive index layers 2 and a low-refractive index layer 1b that is one of the low-refractive index layers 1, that is located on the side of the high-refractive index layer 2a opposite to the substrate 10, and that is closest to the high-refractive index layer 2a. That is, the low-refractive index layers 1, the high-refractive index layers 2, and the first intermediate layers 3 are stacked in that order from the substrate 10.

Figure 1B:
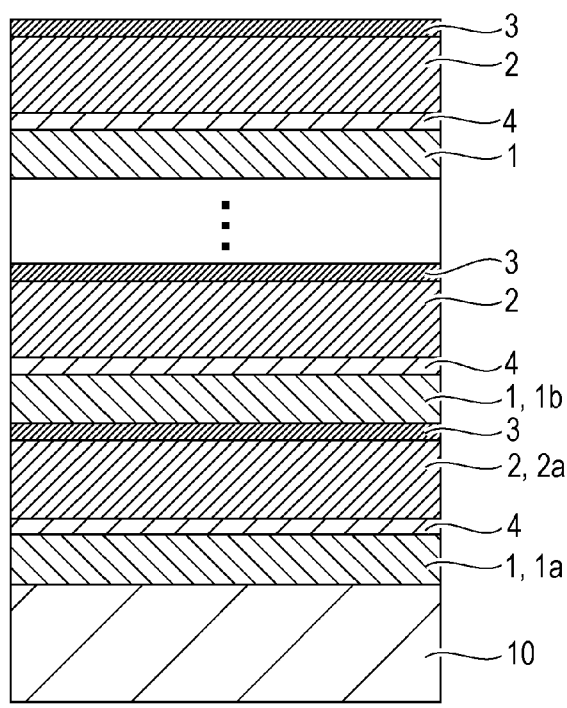
FIG. 1B is a schematic view of another example of the reflector according to the first embodiment of the present invention.

On the other hand, a reflector shown in FIG. 1B includes second intermediate layers (fourth layers) 4 containing GaN in addition to the configuration of the reflector shown in FIG. 1A. This reflector is composed of a plurality of stacked structures each including a corresponding one of the low-refractive index layers 1, a corresponding one of the second intermediate layers 4, a corresponding one of the high-refractive index layers 2, and a corresponding one of the first intermediate layers 3. One of the second intermediate layers 4 is placed between a high-refractive index layer 2a that is one of the high-refractive index layers 2 and a low-refractive index layer 1a that is one of the low-refractive index layers 1, that is located on the side of the high-refractive index layer 2a close to the substrate 10, and that is closest to the high-refractive index. layer 2a. That is, each of the high-refractive index. layers 2 is placed between a corresponding one of the first intermediate layers 3 and a corresponding one of the second intermediate layers 4. The low-refractive index layers 1, the second intermediate layers 4, the high-refractive index layers 2, and the first intermediate layers 3 are stacked in that order from the substrate 10.

The substrate 10 may have the same lattice constant as that of GaN. Examples of the substrate 10 include GaN substrates and those obtained by forming GaN on bases (made of, for example, sapphire, SiC, Si, GaAs, or the like) capable of growing GaN.

The low-refractive index layers 1 contain $Al_xGa_{1-x}N$ with tensile strain $\epsilon_1$. The Al content and thickness of the low-refractive index layers 1 are adjusted such that the relationship between the strain and the thickness is satisfied as described below. The refractive index of the low-refractive index layers 1 is less than the refractive index of the high-refractive index layers 2 and is preferably 2.00 to 2.45. The difference in refractive index between the low-refractive index layers 1 and the high-refractive index layers 2 may be 0.10 or more.

The high-refractive index layers 2 contain $In_yGa_{1-y}N$ with compressive strain $\epsilon_2$. In order to suppress the light absorption of the high-refractive index layers 2, the In content of the high-refractive index layers 2 is adjusted such that the bandgap of $In_yGa_{1-y}N$ is greater than the energy of reflected light. The thickness $t_2$ of the high-refractive index layers 2 is $\lambda/4n$, where $\lambda$ is the central wavelength of the reflection band of the reflector and n is the refractive index of the high-refractive index layers 2. The optical thickness of the high-refractive index layers 2 may be $\lambda/8$ to $3\lambda/8$ and is preferably $3\lambda/16$ to $5\lambda/16$ as described above. The refractive index of the high-refractive index layers 2 is greater than the refractive index of the low-refractive index layers 1 and is preferably 2.50 to 2.80.

The first intermediate layers 3 contain GaN and are placed between the low-refractive index layers 1 and the high-refractive index layers 2. One of the first intermediate layers 3 is placed between the low-refractive index layer 1b and the high-refractive index layer 2a that is located closer to the substrate 10 than the low-refractive index layer 1b and that is located closest to the low-refractive index layer 1b. The first intermediate layers 3 contain the same material as that contained in the substrate 10 and therefore are not strained. The thickness of the first intermediate layers 3 needs to be sufficient to compensate for the optical thickness of the low-refractive index layers 1. In order to allow the first intermediate layers 3 to function as protective layers for the high-refractive index layers 2, the thickness of the first intermediate layers 3 may be 5 nm or more. When the first intermediate layers 3 are thick, the proportion of the low-refractive index layers 1 is small and the difference in refractive index between the low-refractive index layers 1 and the high-refractive index layers 2 is substantially small. Therefore, the thickness of the first intermediate layers 3 is preferably less than the thickness of the low-refractive index layers 1 and more preferably less than or equal to half the thickness of the low-refractive index layers 1.

Since GaN in the first intermediate layers 3 is higher in thermal conductivity than $Al_xGa_{1-x}N$ in the low-refractive index layers 1, the reduction in thickness of the low-refractive index layers 1 and the presence of the first intermediate layers 3 allow the substrate 10 to have good heat dissipation in an in-plane direction and a vertical direction. Since GaN in the first intermediate layers 3 is lower in electrical resistivity than $Al_xGa_{1-x}N$ in the low-refractive index layers 1, the presence of the first intermediate layers 3, which contain GaN, leads to a reduction in electrical resistivity.

The second intermediate layers 4 contain GaN. One of the second intermediate layers 4 is placed between the low-refractive index layer 1a and the high-refractive index layer 2a that is located on the side of the low-refractive index layer 1a opposite to the substrate 10 and that is located. closest to the low-refractive index layer 1a. The second intermediate layers 4 contain the same material as that contained in the substrate 10 and therefore are not strained. In the case of providing the second intermediate layers 4, the total optical thickness of the first and second intermediate layers 3 and 4 may be set so as to compensate for a shortage of the optical thickness of the low-refractive index layers 1. That is, in the case of providing no second intermediate layers 4, the sum of the optical thicknesses of the low refractive index layers 1, the high-refractive index layers 2, and the first intermediate layers 3 may be about $\lambda/2$. In the case of providing the second intermediate layers 4, the sum of the optical thicknesses of the low-refractive index layers 1, the high-refractive index layers 2, the first intermediate layers 3, and the second intermediate layers 4 may be about $\lambda/2$. The thickness of the second intermediate layers 4 is 5 nm or more, is preferably less than the thickness of the low-refractive index layers 1, and is more preferably less than or equal to half the thickness of the low-refractive index layers 1.

The low-refractive index layers 1, the high-refractive index layers 2, the first intermediate layers 3, and the second intermediate layers 4 may be doped with, for example, a donor impurity such as Si or an acceptor impurity such as Mg for the purpose of imparting electrical conductivity to the low-refractive index layers 1, the high-refractive index layers 2, the first intermediate layers 3, and the second. intermediate layers 4.

Manufacturing Method

A method for manufacturing a reflector according to the present invention is described below. Layers are epitaxially grown under optimum conditions. In particular, $In_yGa_{1-y}N$ is epitaxially grown at a temperature of 600° C. to 900° C. in a nitrogen atmosphere so as to form high refractive index layers 2. $A_xGa_{1-x}N$ is epitaxially grown at 1,000° C. or higher in a hydrogen atmosphere so as to form low-refractive index layers 1. GaN is epitaxially grown under the same conditions as those for growing $In_yGa_{1-y}N$ so as to form first intermediate layers 3 because the first intermediate layers 3 are formed subsequently to the high-refractive index layers 2. Furthermore, GaN is epitaxially grown under the same conditions as those for growing $Al_xGa_{1-x}N$ so as to form second intermediate layers 4 because the second intermediate layers 4 are formed subsequently to the low-refractive index layers 1.

Among epitaxial growth processes, a metal-organic chemical vapor deposition (MOCVD) process is particularly used. Raw materials used are group III sources such as trimethyl gallium (TMGa), trimethyl aluminum (TMAl), and trimethyl indium (TMIn) and a nitrogen source such as ammonia ($NH_3$). In the case of allowing the reflector to be electrically conductive, silane ($SiH_4$) or disilane ($Si_2H_6$) can be used as a Si source for a donor impurity or cyclopentadienyl magnesium ($Cp_2Mg$) can be used as a Mg source for an acceptor impurity. Crystal growth is controlled in such a way that a valve for a group III source is turned on or off with the supply of $NH_3$, which is a nitrogen source, continued. The reason why the supply of $NH_3$ is continued is to prevent nitrogen from being eliminated from a growing nitride semiconductor.

First, a substrate 10 containing GaN is prepared and is set in a manufacturing apparatus. After nitrogen ($N_2$) and $NH_3$ are supplied to a reactor placed in the manufacturing apparatus, the substrate 10 is heated to a temperature (for example, 1,000° C.) most suitable for the crystal growth of $Al_xGa_{1-x}N$. After this temperature (for example, 1,000° C.) is attained, nitrogen is switched to hydrogen with the supply of $NH_3$ continued and TMGa and TMAl are supplied over the substrate 10 such that $Al_xGa_{1-x}N$ is epitaxially grown, whereby one of the low-refractive index layers 1 is formed.

Next, in order to grow $In_yGa_{1-y}N$, hydrogen is switched to nitrogen with the supply of $NH_3$ continued and the temperature of the substrate 10 is reduced to a temperature (for example, 850° C.) most suitable for the crystal growth of $In_yGa_{1-y}N$. After this temperature (for example, 850° C.) is attained, TMGa and TMIn are supplied over the low-refractive index layer 1 with the supply of $NH_3$ continued such that $In_yGa_{1-y}N$ is epitaxially grown, whereby one of the high-refractive index layers 2 is formed.

Next, GaN is epitaxially grown to a thickness of 5 nm or more on the high-refractive index layer 2 with the supply of $NH_3$ continued, whereby one of the first intermediate layers 3 is formed. Since the first intermediate layer 3 can be grown under the same conditions as those for growing the high-refractive index layer 2, the first intermediate layer 3 is preferably grown subsequently to the high-refractive index layer 2 with the supply of TMIn only stopped.

In the case where GaN for forming the first intermediate layer 3 is not present on the high-refractive index layer 2, $In_yGa_{1-y}N$ in a surface portion of the high-refractive index layer 2 is decomposed by a hydrogen gas or in a heating step of growing $Al_xGa_{1-x}N$ for subsequently formed one of the low-refractive index layers 1. As a result, the surface planarity is reduced due to the formation of droplets of In or the like. The reduction of the surface planarity is a problem caused by the fact that $In_yGa_{1-y}N$ is a mixed crystal of InN and GaN. GaN in the first intermediate layer 3 is slightly decomposed at 1,000° C. or higher not so much as $In_yGa_{1-y}N$. However, some of Ga atoms formed by decomposition actively migrate on the surface of the first intermediate layer 3 to bind to nitrogen atoms again. Therefore, the influence of a reduction in planarity due to decomposition is slight on the surface of the first intermediate layer 3. The first intermediate layer 3 is preferably grown to such a thickness that does not cause the thermal decomposition. of the high-refractive index layer 2 and in particular, may be grown to a thickness of 5 nm or more. In order to reduce the decomposition of the first intermediate layer 3, the heating time taken in preparation for the formation of another one of the low refractive index layers 1 is preferably minimized.

Thereafter, the growth of each of the low-refractive index layers 1, the high-refractive index layers 2, and the first intermediate layers 3 is alternately repeated several times until a configuration capable of achieving a desired refractive index is obtained. In the manufacturing method according to this embodiment, the case of foaming one of the low-refractive index layers 1 on the substrate 10 is described. One of the high-refractive index layers 2 may be formed on the substrate 10.

One of the second intermediate layers 4 may be formed between a step of forming one of the low-refractive index layers 1 and a step of forming one of the high-refractive index layers 2 as required. In particular, since the second intermediate layer 4 can be epitaxially grown under the same conditions as those for forming the low refractive index layer 1, the second intermediate layer 4 is preferably grown subsequently to the formation of the low-refractive index layer 1 with the supply of TMAl only stopped. Thereafter, in preparation for the formation of the high-refractive index layer 2, the temperature of the substrate 10 is reduced.

The technical significance of using the second intermediate layers 4 is as described below. When the Al content of the low-refractive index layers 1 high, a large lattice strain is caused and therefore the low-refractive index layers 1 are grown to have a rough surface. Therefore, in order to enhance the crystal quality of the high-refractive index layers 2, the second intermediate layers 4 are preferably formed using GaN, of which atoms are likely to migrate. Thus, if the surface roughness of the low-refractive index layers 1 does not affect the crystal growth of the high-refractive index layers 2 or the reflectivity of the reflector, then the second intermediate layers 4 need not be formed. The second intermediate layers 4 may be formed once in several periods or in every period.

Second Embodiment

Figure 2:
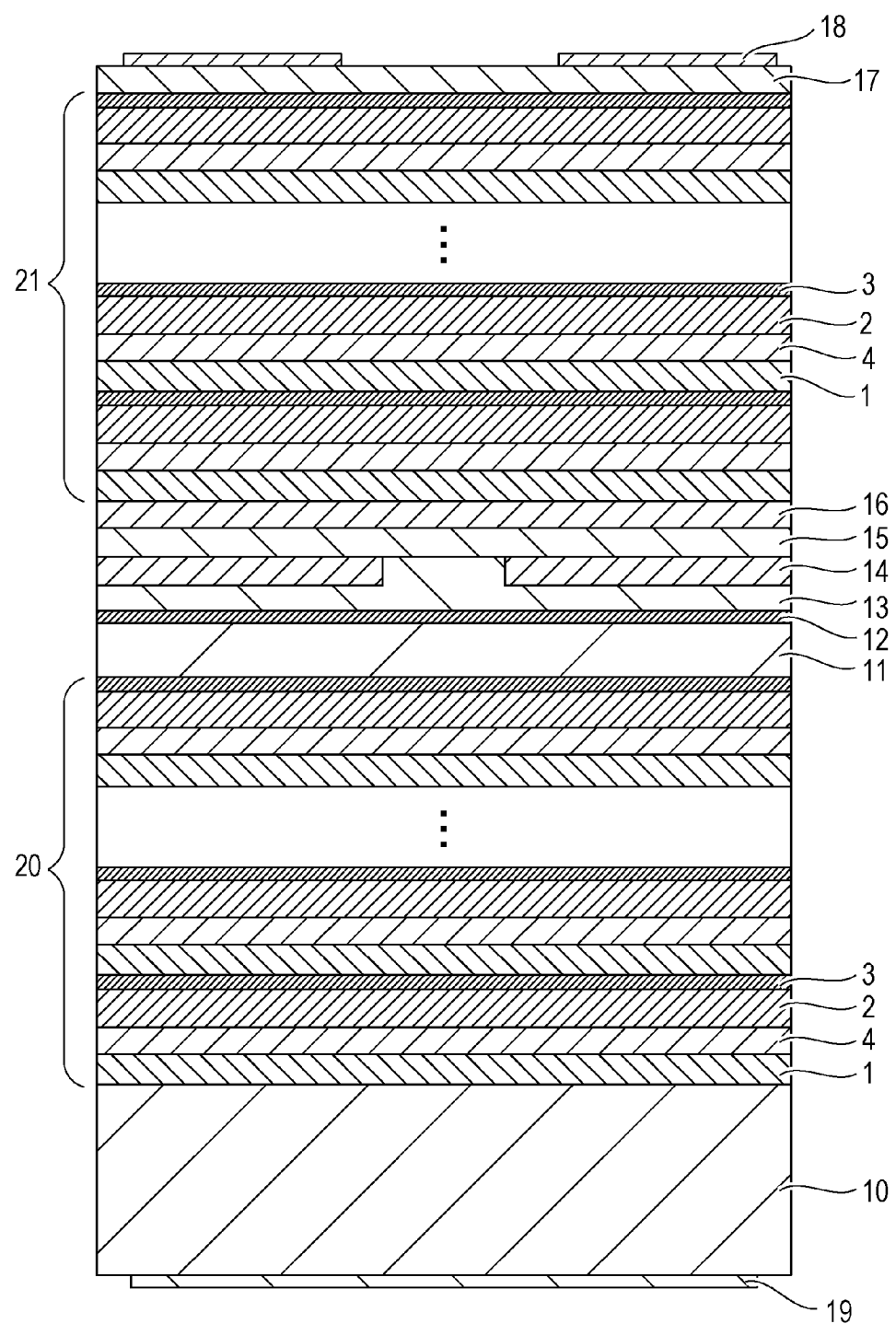
FIG. 2 is a schematic view of an example of a vertical-cavity surface-emitting laser (VCSEL) according to a second embodiment of the present invention.

In this embodiment, a vertical-cavity surface-emitting laser (VCSEL) including a reflector identical to the reflector according to the first embodiment is described. FIG. 2 is a schematic sectional view of an example of the VCSEL. The VCSEL includes a pair of reflectors 20 and 21 and an active layer 12 placed between the reflectors 20 and 21. Referring to FIG. 2, both the reflectors 20 and 21 are identical to the reflector described in the first embodiment with reference to FIG. 1B. At least one of the reflectors 20 and 21 may be identical to the reflector described in the first embodiment with reference to FIG. 1B.

The VCSEL is further described in detail. The reflector 20 is placed on a substrate 10. An electrode 19 is placed on the side of the substrate 10 opposite to the reflector 20. A spacer layer 11, the active layer 12, and a spacer layer 13 are placed on the reflector 20 in that order from the substrate 10.

The active layer 12 has a three-period InGaN/GaN quantum well structure. The spacer layer 13 is overlaid with a current confinement layer 14. The current confinement layer 14 has the function of limiting a region for injecting carriers into the active layer 12 to an opening of the current confinement layer 14 to suppress the conversion of the transverse mode of the VCSEL to a multi-mode.

A carrier-blocking layer 15 and a tunnel junction layer 16 are placed on the current confinement layer 14 in that order. The tunnel junction layer 16 is overlaid with the reflector 21. A contact layer 17 and an electrode 18 are placed on the reflector 21 in that order.

Electrons are injected from one of the electrodes 18 and 19 and holes are injected from the other. When the electrons and the holes recombine with each other in the active layer 12, the active layer 12 emits light. The light emitted therefrom is oscillated between the reflectors 20 and 21 at a wavelength corresponding to the thickness of the reflectors 20 and 21. The thickness of the spacer layers 11 and 13 is adjusted such that an antinode of a standing wave present between the reflectors 20 and 21 overlaps the active layer 12.

The carrier-blocking layer 15 inhibits carriers injected from the electrode 19 from passing through the active layer 12 and migrating to the electrode 18. The tunnel junction layer 16 has the function of assisting carriers injected from the electrode 18 to migrate from the reflector 21 to the carrier-blocking layer 15.

Each layer may contain a known material and can be formed by a known process. The thickness of the layer may be appropriately set depending on the laser emission wavelength or the like.

One of the reflectors 20 and 21 may be movable.

The VCSEL can be used in a lighting device. In particular, the lighting device is composed of arrayed VCSELs identical to the VCSEL.

Third Embodiment

Figure 3:
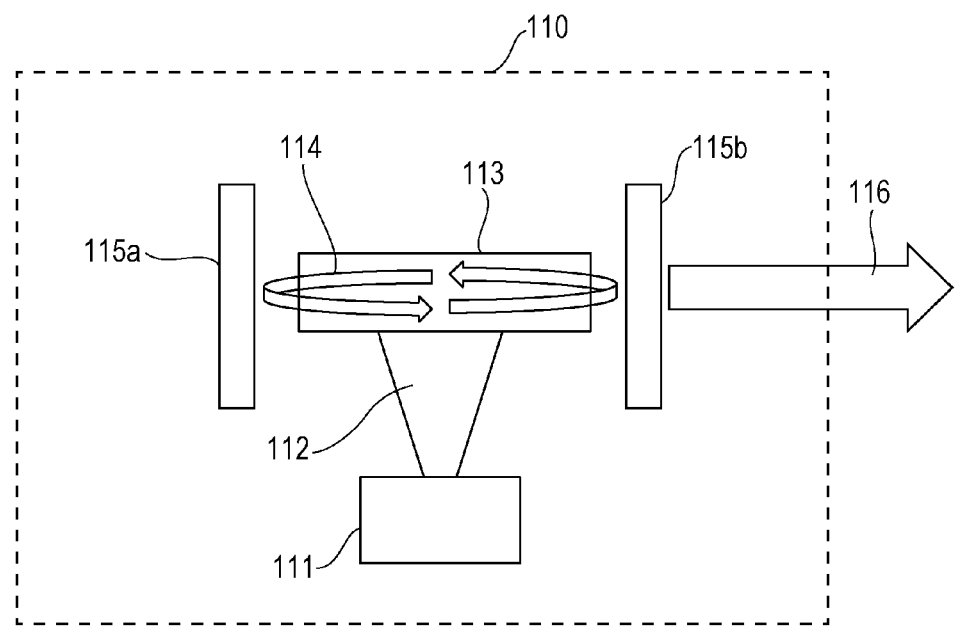
FIG. 3 is a schematic view of an example of a solid-state laser device according to a third embodiment of the present invention.

In this embodiment, a solid-state laser device 110 including the vertical-cavity surface-emitting laser (VCSEL) according to the second embodiment is described with reference to FIG. 3. The solid-state laser device 110 includes a light source 111 including the VCSEL, a solid-state laser medium 113 excited by light emitted by the VCSEL, and two reflective members 115a and 115b. The light source 111 may be one in which an array of VCSELs identical to the VCSEL are integrated for the purpose of increasing the power.

Light 112, emitted. from the light source 111, having the laser emission wavelength of the VCSEL is applied to the solid-state laser medium 113. The solid-state laser medium 113 absorbs the light 112 to emit light 114 in association with laser transition. The light 114 is repeatedly reflected by the reflective members 115a and 115b and therefore the solid-state laser device 110 lases. A solid-state laser beam 116 passing through the reflective member 115b is emitted by the solid-state laser device 110 in a lasing state.

The wavelength λ of the light 112 emitted from the light source 111 is preferably determined depending on the absorption spectrum of the solid-state laser medium 113. That is, the central wavelength of the reflection band of each reflector of the VCSEL is preferably designed in conformity with the absorption spectrum of the solid-state laser medium 113. The composition or thickness of each layer included in the reflector is designed such that the wavelength of the maximum peak in the absorption spectrum of the solid-state laser medium 113 coincides with a wavelength close to the maximum peak in the reflection spectrum of the reflector. When the solid-state laser medium 113 used is, for example, an alexandrite crystal, the wavelength of the maximum peak in the reflection spectrum of the reflector is adjusted to 400 nm, which is close to the maximum peak in the absorption spectrum of the alexandrite crystal. This allows the solid-state laser device 110 to oscillate efficiently.

Fourth Embodiment

Figure 4:
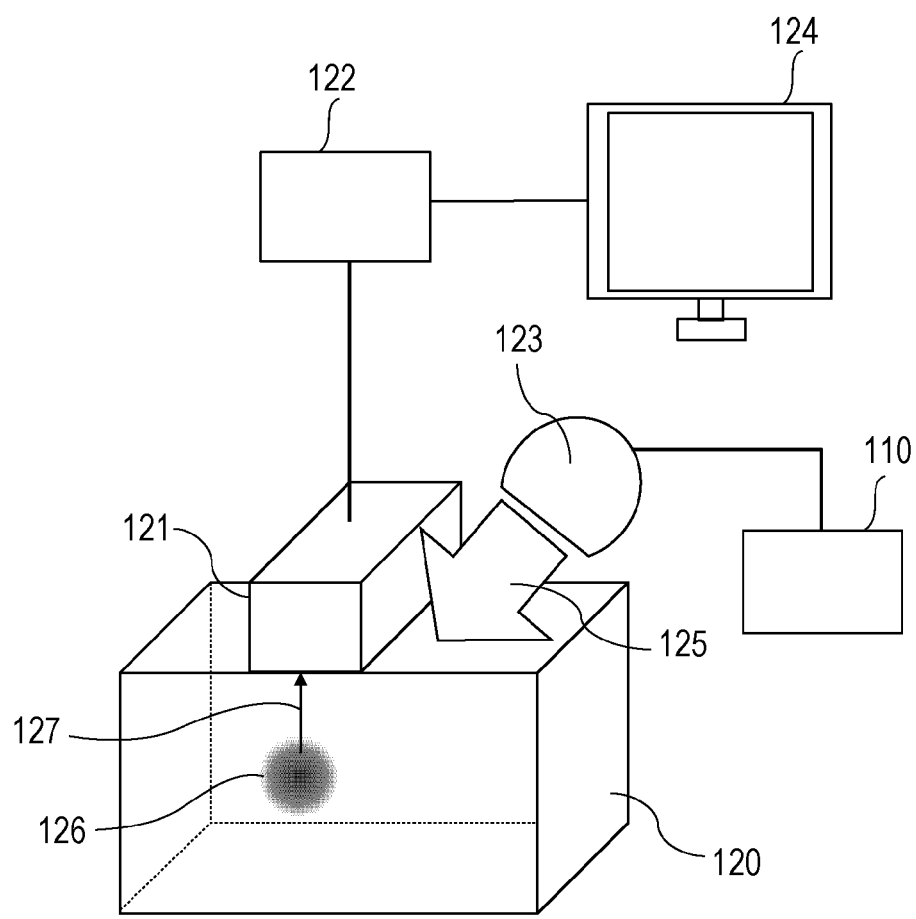
FIG. 4 is a schematic view of an example of an optoacoustic system according to a fourth embodiment of the present invention.

In this embodiment, an optoacoustic system including the solid-state laser device 110 according to the third embodiment is described with reference to FIG. 4. The optoacoustic system includes a probe 121 which detects an elastic wave generated by irradiating a sample 120 with light emitted. by the solid-state laser device 110 and which converts the elastic wave into an electrical signal, an acquisition unit 122 acquiring information about optical properties of the sample 120 on the basis of the electrical signal, and an optical unit 123 for irradiating the sample 120 with light emitted by the solid-state laser device 110 in addition to the solid state laser device 110. The optoacoustic system. may further include a display unit 124 displaying information acquired by the acquisition unit 122.

Light emitted by the solid-state laser device 110 is applied to the sample 120 through the optical unit 123 in the form of pulsed light 125. As a result, an optoacoustic wave 127 is generated from a light absorber 126 present in the sample 120 by an optoacoustic effect. The probe 121 detects the optoacoustic wave 127 propagating in the sample 120 to acquire a time-series electrical signal. The acquisition unit 122 acquires information about an inner portion of the sample 120 on the basis of the time-series electrical signal and displays the information about the inner portion of the sample 120 on the display unit 124.

The wavelength of light that can be emitted by the solid-state laser device 110 is preferably equal to the wavelength of light propagating into the sample 120. In particular, the preferred wavelength is 500 nm to 1,200 nm when the sample 120 is a living organism. In the case of acquiring information about optical properties of tissues near the surface of a living organism, a wider range of wavelength, that is, a wavelength of, for example, 400 nm to 1,600 nm can be used.

information about optical properties of the sample 120 includes the initial sound pressure of an optoacoustic wave, light energy absorption density, an absorption coefficient, and the concentration of a substance contained in the sample 120. Herein, the concentration of a substance include oxygen saturation, oxyhemoglobin concentration, deoxyhemoglobin concentration, and total hemoglobin concentration. The total hemoglobin concentration is the sum of the oxyhemoglobin concentration and the deoxyhemoglobin concentration. In this embodiment, information about optical properties of the sample 120 need not be digital data and may be information about the distribution of sites in the sample 120. That is, the acquisition unit 122 may acquire distribution information including absorption coefficient distribution and oxygen saturation distribution in the form of information about optical properties of the sample 120.

Figure 5:
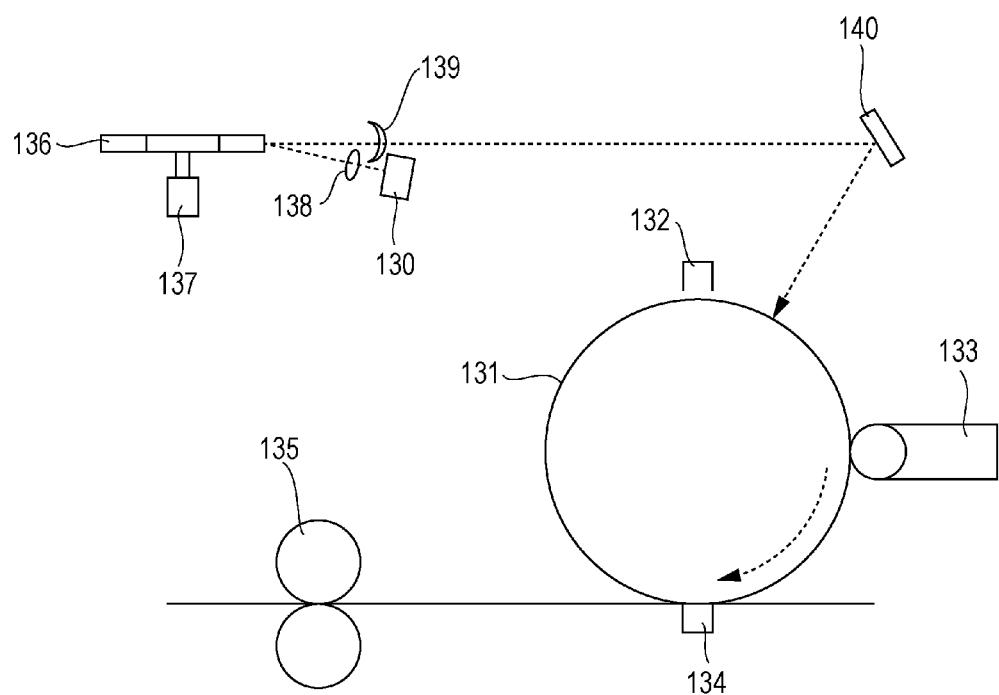
FIG. 5 is a schematic view of an example of an image-forming apparatus according to a fifth embodiment of the present invention.

Fifth Embodiment in this embodiment, an image-forming apparatus including the VCSEL according to the second embodiment is described with reference to FIG. 5. The image-forming apparatus includes a light source 130, a photosensitive drum (photoreceptor) 131, a charger 132, a developing unit 133, a transfer charger 134, a fixing unit 135, a rotatable polygonal mirror 136, a motor 137, a collimator lens 138, a fθ lens 139, and a reflective member 140.

The light source 130 may include the single VCSEL is placed or may be one in which an array of VCSELs identical to the VCSEL are integrated.

The light source 130 is turned on or off with a driver (not shown) depending on an image signal. A laser beam emitted from the light source 130 is applied to the rotatable polygonal mirror 136 through the collimator lens 138. The rotatable polygonal mirror 136 is rotated with the motor 137. Therefore, the laser beam emitted from the light source 130 is varied in reflection angle on a reflecting surface of the rotatable polygonal mirror 136 with the rotation of the rotatable polygonal mirror 136 and is applied to the fθ lens 139 in the form of a polarized beam.

The polarized beam is corrected for distortion or the like with the fθ lens 139, is reflected by the reflective member 140, is applied to the photosensitive drum 131, and is projected on the photosensitive drum 131 in a main scanning direction.

The photosensitive drum 131 is charged with the charger 132 in advance and is sequentially exposed to the projected laser beam, whereby an electrostatic latent image is formed on the photosensitive drum 131. The photosensitive drum 131 is rotated in a direction indicated by an arrow as shown in FIG. 5. The formed electrostatic latent image is developed with the developing unit 133, whereby a visible image is obtained. The visible image is transferred to transfer paper (not shown) with the transfer charger 134. The transfer paper having the visible image is conveyed to the fixing unit 135, is fixed therewith, and is then discharged out of the image-forming apparatus.

Alight source including a plurality of arrayed VCSELs identical to the VCSEL may be used instead of the light source 130 to irradiate a surface of the rotatable polygonal mirror 136 with a plurality of laser beams. This configuration is capable of exposing a plurality of lines to the laser beams together in a main scanning direction of the photosensitive drum 131 and is therefore preferred.

EXAMPLES

Example 1

In this example, a reflector was manufactured. The central wavelength of the reflection band of the reflector was 450 nm. The reflector had a configuration shown in FIG. 1A.

First, a substrate 10 containing GaN was set in an MOCVD system. The substrate 10 was heated to 1,150° C. with a heater placed under the substrate 10 while nitrogen and $NH_3$ were being supplied to the MOCVD system. The temperature of the substrate 10 was measured with a thermocouple placed near the heater.

Next, after the temperature of the substrate 10 reached 1,150° C., nitrogen was switched to hydrogen, TMGa and TMAl were supplied, and $Al_xGa_{1-x}N$ was epitaxially grown on the substrate 10, whereby a low refractive index layer 1 was formed.

Next, in order to grow $In_yGa_{1-y}N$ to a high-refractive index layer 2, hydrogen was switched to nitrogen with the supply of $NH_3$ continued and the temperature of the substrate 10 was reduced to 850° C. After the temperature of the substrate 10 was reduced to 850° C., TMGa and TMIn were supplied and $In_yGa_{1-y}N$ was epitaxially grown on the low refractive index layer 1, whereby the high-refractive index layer 2 was formed.

Subsequently, GaN was epitaxially grown on the high-refractive index layer 2 without varying growth conditions, whereby a first intermediate layer 3 was formed. In this operation, the supply of TMIn was cut off. In order to prevent the surface decomposition of the high-refractive index layer 2 in a subsequent step of heating the substrate 10, the thickness of the first intermediate layer 3 was adjusted to 10 nm.

The temperature of the substrate 10 was increased to 1,150° C. again in 3 minutes. In this step, the thickness of the first intermediate layer 3 was reduced to 6.5 nm by decomposition. Thereafter, 55 periods of low-refractive index layers 1, high-refractive index layers 2, and first intermediate layers 3 were deposited in total in that order.

The composition, refractive index, and strain of each of these layers, the absolute value of the product of the strain and thickness thereof, and $|\epsilon_2 t_2|/|\epsilon_1 t_1|$ are shown in Table 1. As is clear from Table 1, the low-refractive index layers 1 and the high-refractive index layers 2 satisfy inequality (2). Furthermore, $|\epsilon_2 t_2|/|\epsilon_1 t_1|$ satisfies Inequalities (2) to (4). The In content y of the high-refractive index layers 2 and the Al content x of the low-refractive index layers 1 satisfy Inequality (5).

The high-refractive index layers 2 have an optical thickness of 112.50 nm. This value is within the range of λ/8 to 3λ/8 and is also within the range of 3λ/16 to 5λ/16. The sum of the optical thicknesses of the low-refractive index layers 1, the high-refractive index layers 2, and the first intermediate layers 3 is 225.19 nm and is substantially equal to λ/2.

Figure 6:
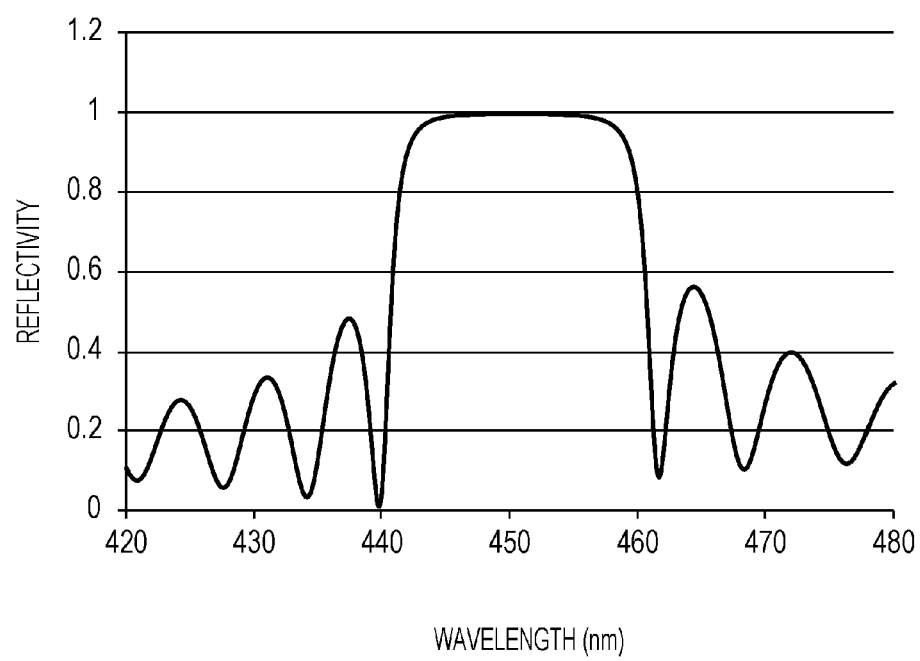
FIG. 6 is a graph showing reflection properties of a reflector manufactured in Example 1.

FIG. 6 shows reflection properties of the reflector. The reflector has a reflection band of 444 nm to 457 nm and a reflectivity of 99.5% or more at a wavelength of 444 nm to 457 nm.

TABLE 1

|  | Low-refractive index layers | High-refractive index layers | First intermediate layers |
|---|---|---|---|
| Material | $Al_{0.20}Ga_{0.80}N$ | $In_{0.04}Ga_{0.96}N$ | GaN |
| Refractive index | 2.36 | 2.50 | 2.45 |
| Thickness (nm) | 41 | 45 | 6.5 |
| Strain | 0.0048525 | −0.004483 | 0 |
| Absolute value of product of strain and thickness | 0.199 | 0.2017 | 0 |
| $|\epsilon_2 t_2|/|\epsilon_1 t_1|$ |  | 1.013 |  |

Example 2

In this example, a reflector was manufactured. The central wavelength of the reflection band of the reflector was 405 nm. The reflector had a configuration shown in FIG. 1B.

First, a substrate 10 containing CaN was set in an MOCVD system. The substrate 10 was heated to 1,150° C. with a heater placed under the substrate 10 while nitrogen and $NH_3$ were being supplied to the MOCVD system. The temperature of the substrate 10 was measured with a thermocouple placed near the heater.

Next, after the temperature of the substrate 10 reached 1,150° C., nitrogen was switched to hydrogen, TMGa and TMAl were supplied, and $Al_xGa_{1-x}N$ was epitaxially grown on the substrate 10, a low-refractive index layer 1 was formed. Subsequently, GaN was epitaxially grown to a thickness of 5 nm on the low-refractive index layer 1 without varying growth conditions, whereby a second intermediate layer 4 was formed. In this operation, the supply of TMAl was cut off.

Next, in order to grow $In_yGa_{1-y}N$ to a high-refractive index. layer 2, hydrogen was switched to nitrogen with the supply of $NH_3$ continued and. the temperature of the substrate 10 was reduced to 850° C. After the temperature of the substrate 10 was reduced to 850° C., TMGa and TMIn were supplied and $In_yGa_{1-y}N$ was epitaxially grown on the second intermediate layer 4, whereby the high-refractive index layer 2 was formed.

Subsequently, GaN was epitaxially grown on the high-refractive index layer 2 without varying growth conditions, whereby a first intermediate layer 3 was formed. In this operation, the supply of TMin was cut off. In order to prevent the surface decomposition of the high-refractive index layer 2 in a subsequent step of heating the substrate 10, the thickness of the first intermediate layer 3 was adjusted to 10 nm.

The temperature of the substrate 10 was increased to 1,150° C. again in 3 minutes. In this step, the thickness of the first intermediate layer 3 was reduced to 5 nm by decomposition. Thereafter, 50 periods of low-refractive index layers 1, high-refractive index layers 2, and first intermediate layers 3 were deposited in total in that order.

The composition, refractive index, and strain of each of these layers, the absolute value of the product of the strain and thickness thereof, and $|\epsilon_2 t_2|/|\epsilon_1 t_1|$ are shown in Table 2. As is clear from Table 2, the low-refractive index layers 1 and the high-refractive index layers 2 satisfy Inequality (2). Furthermore, $|\epsilon_2 t_2|/|\epsilon_1 t_1|$ satisfies inequalities (2) to (4). The In content y of the high-refractive index layers 2 and the Al content x of the low-refractive index layers 1 satisfy Inequality (5).

The high-refractive index layers 2 have an optical thickness of 105.02 nm. This value is within the range of $\lambda/8$ to $3\lambda/8$ and is also within the range of $3\lambda/16$ to $5\lambda/16$. The sum of the optical thicknesses of the low-refractive index layers 1, the high-refractive index layers 2, the first intermediate layers 3, and the second. intermediate layers 4 is 202.59 nm and is substantially equal to $\lambda/2$.

Figure 7:
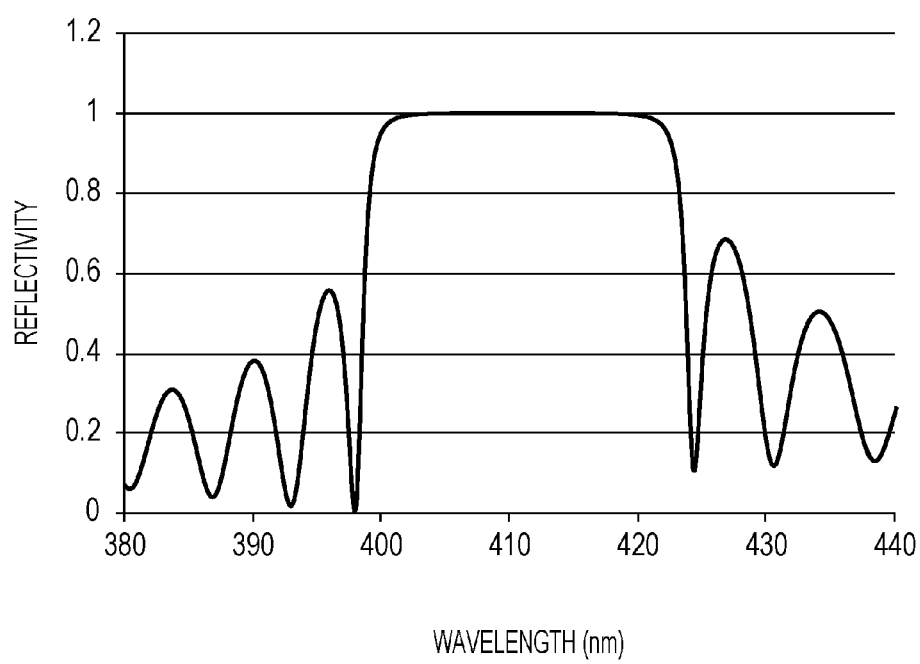
FIG. 7 is a graph showing reflection properties of a reflector manufactured in Example 2.

FIG. 7 shows reflection properties of the reflector. The reflector has a reflection hand of 401 nm to 421 am and a reflectivity of 99.5% or more at a wavelength of 401 nm to 421.

TABLE 2

|  | Low-refractive index layers | Second intermediate layers | High-refractive index layers | First intermediate layers |
|---|---|---|---|---|
| Material | $Al_{0.30}Ga_{0.70}N$ | GaN | $In_{0.05}Ga_{0.95}N$ | GaN |
| Refractive index | 2.41 | 2.54 | 2.63 | 2.54 |
| Thickness (nm) | 31 | 4 | 40 | 5 |
| Strain | 0.007297 | 0 | −0.005597 | 0 |
| Absolute value of product of strain and thickness | 0.2262 | 0 | 0.2239 | 0 |
| $|\epsilon_2 t_2|/|\epsilon_1 t_1|$ |  | 0.99 |  |  |

Example 3

In this example, a reflector was manufactured. The central wavelength of the reflection band of the reflector was 530 nm. The reflector had a configuration shown in FIG. 1B. Incidentally, a method for manufacturing the reflector is the same as that described in Example 2 and is omitted.

The composition, refractive index, and strain of each of low-refractive index layers 1, high refractive index layers 2, first intermediate layers 3, and second intermediate layers 4; the absolute value of the product of the strain and thickness thereof; and $|\epsilon_2 t_2|/|\epsilon_1 t_1|$ are shown in Table 3. As is clear from Table 2, the low-refractive index layers 1 and the high-refractive index layers 2 satisfy Inequality (2). Furthermore, $|\epsilon_2 t_2|/|\epsilon_1 t_1|$ satisfies inequalities (2) to (4). The In content y of the high-refractive index layers 2 and the Al content x of the low-refractive index layers 1 satisfy Inequality (5).

The high-refractive index layers 2 have an optical thickness of 100.80 nm. This value is within the range of $\lambda/8$ to $3\lambda/8$ and is also within the range of $3\lambda/16$ to $5\lambda/16$. The sum of the optical thicknesses of the low-refractive index layers 1, the high-refractive index layers 2, the first intermediate layers 3, and the second intermediate layers 4 is 259.74 nm and is substantially equal to $\lambda/2$.

Figure 8:
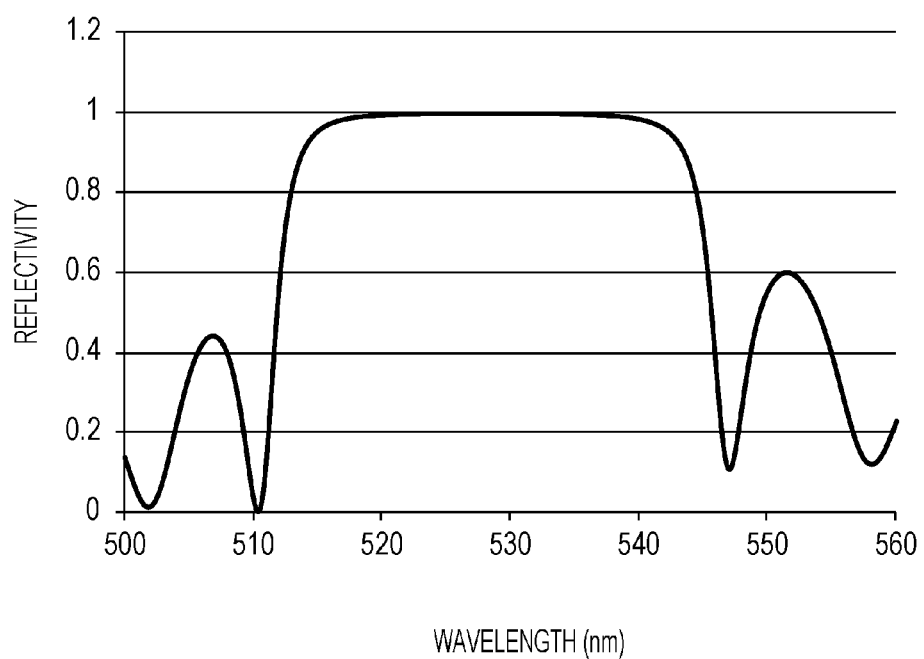
FIG. 8 is a graph showing reflection properties of a reflector manufactured in Example 3.

FIG. 8 shows reflection properties of the reflector. The reflector has a reflection band of 518 nm to 539 nm and a reflectivity of 99.5% or more at a wavelength of 518 nm to 539 nm.

TABLE 3

|  | Low-refractive index layers | Second intermediate layers | High-refractive index layers | First intermediate layers |
|---|---|---|---|---|
| Material | $Al_{0.40}Ga_{0.60}N$ | GaN | $In_{0.08}Ga_{0.92}N$ | GaN |
| Refractive index | 2.28 | 2.41 | 2.52 | 2.41 |
| Thickness (nm) | 38 | 15 | 40 | 15 |
| Strain | 0.009752 | 0 | −0.008926 | 0 |
| Absolute value of product of strain and thickness | 0.3706 | 0 | 0.3748 | 0 |
| $|\epsilon_2 t_2|/|\epsilon_1 t_1|$ |  | 1.011 |  |  |

Example 4

In this example, a vertical-cavity surface-emitting laser (VCSEL) was manufactured using the reflector manufactured in Example 2. The VCSEL had a configuration shown in FIG. 2.

First, a reflector 20 substantially identical to the reflector manufactured in Example 2 was formed on a substrate 10 containing GaN. When being formed, the reflector 20 was doped with Si so as to have n-type conductivity. Incidentally, the reflector 20 is substantially identical to the reflector manufactured in Example 2 except that the reflector 20 has n-type conductivity due to Si doping; hence, a method for forming the reflector 20 is omitted.

After the reflector 20 was formed, a spacer layer 11 and an active layer 12 were formed thereon. The active layer 12 had a three-period $In_{0.11}Ga_{0.89}N$/GaN quantum well structure in which $In_{0.11}Ga_{0.89}N$ and GaN were 3 nm and 7 nm thick, respectively.

Thereafter, a spacer layer 13 was formed on the active layer 12 and an AlN-containing layer was formed thereon. Next, a current confinement structure was formed in the AlN-containing layer. The substrate 10 was taken out of a manufacturing apparatus once and an opening with a diameter of 10 μm was formed in the AlN-containing layer by photolithography and dry etching, whereby a current confinement layer 14 is formed.

After the substrate 10 was set in the manufacturing apparatus again, a carrier-blocking layer 15 and tunnel unction layer 16 for suppressing the overflow of electrons were formed. The carrier-blocking layer 15 had a thickness of 20 nm and was made of p-$Al_{0.20}Ga_{0.80}N$. The tunnel junction layer 16 had a two-layer structure consisting of a 5 nm thick. $In_{0.05}Ga_{0.95}N$ sub-layer doped with Mg at $1\times10^{20}$ $cm^{-3}$ and a 10 nm thick GaN sub layer doped with Si at $1\times10^{20}$ $cm^{-3}$.

Next, a reflector 21 was formed. The reflector 21, as well as the reflector 20, was substantially identical to the reflector manufactured in Example 2 except that the reflector 21 was doped with Si.

Next, n-GaN was grown to a thickness of 20 nm on the reflector 21, whereby a contact layer 17 for forming an electrode was formed. Finally, an n-type electrode 18 with an opening was formed on the contact layer 17 and an n-type electrode 19 was formed on the back surface of the substrate 10.

The VCSEL was manufactured as described above.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST 10 substrate
1 Low-refractive index layers (first layers)
2 High-refractive index layers (second layers)
3 First intermediate layers (third layers)
4 Second Intermediate layers (fourth layers)

The invention claimed is:

1. A reflector comprising:
a substrate containing GaN;
first layers containing $Al_xGa_{1-x}N$;
second layers containing $In_yGa_{1-y}N$; and
a third layer containing GaN, the first, second, and third layers being stacked on the substrate,
wherein the first and second layers are alternately stacked, the third layer is placed between one of the first layers and one of the second layers,
wherein x in $Al_xGa_{1-x}N$ and y in $In_yGa_{1-y}N$ satisfy the inequality $0.00<4.66y<x\leq1.00$,
wherein the first layers have a thickness less than the thickness of the second layers, and
wherein the second layers have an optical thickness of $\lambda/8$ to $3\lambda/8$, where $\lambda$ is the central wavelength of the reflection band of the reflector.

2. The reflector according to claim 1, wherein the second layers have an optical thickness of $3\lambda/16$ to $5\lambda/16$.

3. The reflector according to claim 1, wherein the third layer is placed between one of the second layers and one of the first layers that is located on a side opposite to a substrate side with respect to the one of the second layers and that is closest to the one of second layers.

4. The reflector according to claim 3, further comprising a fourth layer, wherein the fourth layer is placed between one of the second layers and one of the first layers that is located on a side close to the substrate with respect to the one of the second layers and that is closest to the one of the second layers.

5. The reflector according to claim 4, wherein the fourth layer has a thickness of 5 nm or more.

6. The reflector according to claim 4, wherein the fourth layer has a thickness less than the thickness of the first layers.

7. The reflector according to claim 4, wherein the fourth layer has a thickness less than or equal to half the thickness of the first layers.

8. The reflector according to claim 1, wherein the third layer has a thickness of 5 nm or more.

9. The reflector according to claim 1, wherein the third layer has a thickness less than the thickness of the first layers.

10. The reflector according to claim 1, wherein the third layer has a thickness less than or equal to half the thickness of the first layers.

11. The reflector according to claim 1, wherein y in $In_yGa_{1-y}N$ is 0.02 to 0.21.

12. The reflector according to claim 1, wherein y in $In_yGa_{1-y}N$ is 0.02 to 0.11.

13. The reflector according to claim 1, wherein y in $In_yGa_{1-y}N$ is 0.02 to 0.09.

14. The reflector according to claim 1, wherein x in $Al_xGa_{1-x}N$ is 0.09 to 0.50.

15. The reflector according to claim 1, wherein x in $Al_xGa_{1-x}N$ is 0.09 to 0.40.

16. The reflector according to claim 1, wherein the following inequality is satisfied:

$$0.80\leq|\epsilon_2 t_2|/|\epsilon_1 t_1|\leq1.20$$

where $\epsilon_1$ is the strain of the first layers, $t_1$ is the thickness of the first layers, $\epsilon_2$ is the strain of the second layers, and $t_2$ is the thickness of the second layers.

17. A surface-emitting laser comprising:
a pair of reflectors; and
an active layer placed between the reflectors,
wherein at least one of the reflectors is the reflector according to claim 1.

18. A solid-state laser device comprising:
the surface-emitting laser according to claim 17; and
a solid-state laser medium excited by light emitted by the surface-emitting laser.

19. An optoacoustic system comprising:
the solid-state laser device according to claim 18;
a probe which detects an elastic wave generated by irradiating a sample with light emitted by the solid-state laser device and which converts the elastic wave into an electrical signal; and
an acquisition unit which acquires information about optical properties of the sample on the basis of the electrical signal.

20. An image-forming apparatus comprising:
the surface-emitting laser according to claim 17; and
a photosensitive drum exposed to light emitted by the surface-emitting laser.

* * * * *